US006540587B1

United States Patent
Gotkis et al.

(10) Patent No.: US 6,540,587 B1
(45) Date of Patent: Apr. 1, 2003

(54) INFRARED END-POINT DETECTION SYSTEM

(75) Inventors: Yehiel Gotkis, Fremont, CA (US); Rodney Kistler, Los Gatos, CA (US)

(73) Assignee: Lam Research Corporation, Fremont, CA (US)

( * ) Notice: Subject to any disclaimer, the term of this patent is extended or adjusted under 35 U.S.C. 154(b) by 125 days.

(21) Appl. No.: 09/688,013

(22) Filed: Oct. 13, 2000

(51) Int. Cl.[7] .................................................. B24B 1/00
(52) U.S. Cl. ................................ 451/5; 451/8; 451/287; 451/288; 156/636.1
(58) Field of Search ........................... 451/5, 7, 8, 11, 451/41, 53–57, 67, 285, 287, 288, 289, 460; 156/636.1

(56) References Cited

U.S. PATENT DOCUMENTS

| 5,196,353 A | * | 3/1993 | Sandhu et al. ................. 438/5 |
| 5,605,487 A | * | 2/1997 | Hileman et al. ............... 451/5 |
| 5,722,875 A | * | 3/1998 | Iwashita et al. .............. 451/8 |
| 5,872,633 A | | 2/1999 | Holzapfel et al. |
| 5,882,244 A | * | 3/1999 | Hiyama et al. ................ 451/7 |
| 5,957,750 A | * | 9/1999 | Brunelli ....................... 451/7 |
| 6,074,517 A | | 6/2000 | Taravade |
| 6,077,783 A | * | 6/2000 | Allman et al. ............ 438/691 |
| 6,241,847 B1 | * | 6/2001 | Allman et al. .......... 156/636.1 |

FOREIGN PATENT DOCUMENTS

| JP | 2000015557 | 1/2000 |
| WO | WO 00/12263 | 3/2000 |

* cited by examiner

Primary Examiner—Joseph J. Hail, III
Assistant Examiner—David B. Thomas
(74) Attorney, Agent, or Firm—Martine & Penilla, LLP

(57) ABSTRACT

A chemical mechanical planarization system and methods for implementing infrared detection of process state and substrate surface composition are provided. In one example, the chemical mechanical planarization system includes a substrate chuck to hold and rotate a substrate, a preparation head mounted on a preparation carrier, and a conditioning head mounted on a conditioning carrier. The preparation head is configured to be applied against the substrate, overlapping at least a portion of the substrate of an area smaller than the entire surface area of the substrate. The system further includes an infrared sensor positioned over the substrate to sense infrared emissions from the surface of the substrate. Several examples of infrared sensors are provided including single point, scanning, and array infrared sensors. In another example, a method of determining process state and surface composition of a substrate using infrared sensing is provided. During chemical mechanical planarization, an infrared sensor is positioned to sense infrared emissions from the surface of a substrate, and to analyze the infrared emissions to determine process state and to generate a topographical detail of the substrate.

25 Claims, 10 Drawing Sheets

INFRARED END-POINT DETECTION SYSTEM

BACKGROUND OF THE INVENTION

1. Field of the Invention

The present invention relates generally to the chemical mechanical planarization (CMP) of substrates, and more particularly, to techniques for end-point detection in CMP.

2. Description of the Related Art

In the fabrication of semiconductor devices, there is a need to perform CMP operations, including planarization, buffing and substrate cleaning. Typically, integrated circuit devices are in the form of multi-level structures. At the substrate level, transistor devices having diffusion regions are formed. In subsequent levels, interconnect metallization lines are patterned and electrically connected to the transistor devices to define the desired functional device. As is well known, patterned conductive layers are insulated from other conductive layers by dielectric materials, such as silicon dioxide. At each metallization level there is a need to planarize metal or associated dielectric material. Without planarization, fabrication of additional metallization layers becomes substantially more difficult due to the higher variations in the surface topography. In other applications, metallization line patterns are formed in the dielectric material, and then metal CMP operations are performed to remove excess metallization, e.g., such as copper.

In the prior art, CMP systems typically implement belt, orbital, or brush stations in which belts, pads, or brushes are used to scrub, buff, polish and otherwise prepare a substrate. In some applications, an abrasive substance in suspension, known as slurry, is used to facilitate and enhance the CMP operation. Slurry is most usually introduced onto a moving preparation surface, e.g., belt, pad, brush, and the like, and distributed over the preparation surface as well as the surface of the substrate being buffed, polished, or otherwise prepared by the CMP process. The distribution is generally accomplished by a combination of the movement of the preparation surface, the movement of the semiconductor wafer and the friction created between the semiconductor wafer and the preparation surface.

FIG. 1A shows a cross sectional view of a dielectric layer 102 undergoing a fabrication process that is common in constructing damascene and dual damascene interconnect metallization lines. The dielectric layer 102 has a diffusion barrier layer 104 deposited over the etch-patterned surface of the dielectric layer 102. The diffusion barrier layer 104, as is well known, is typically titanium nitride (TiN), tantalum (Ta), tantalum nitride (TaN) or a combination of tantalum nitride (TaN) and tantalum (Ta). Once the diffusion barrier layer 104 has been deposited to the desired thickness, a metal layer, e.g., copper, 104 is formed over the diffusion barrier layer in a way that fills the etched features in the dielectric layer 102. Some excessive diffusion barrier and metallization material is also inevitably deposited over the field areas. In order to remove these overburden materials and to define the desired interconnect metallization lines and associated vias (not shown), a metal chemical mechanical planarization (CMP) operation is performed.

As mentioned above, the metal CMP operation is designed to remove the top metallization material from over the dielectric layer 102. For instance, as shown in FIG. 1B, the overburden portion of the copper layer 106 and the diffusion barrier layer 104 have been removed. As is common in CMP operations, the CMP operation must continue until all of the overburden metallization and diffusion barrier material 104 is removed from over the dielectric layer 102. However, in order to ensure that all the diffusion barrier layer 104 is removed from over the dielectric layer 102, there needs to be a way of monitoring the process state and the state of the wafer surface during the CMP processing. This is commonly referred to as end-point detection. In multi-step CMP operations there is a need to ascertain multiple end-points (e.g., such as to ensure that the copper (Cu) is removed from over the diffusion barrier layer; and to ensure that the diffusion barrier layer is removed from over the dielectric layer). Thus, end-point detection techniques are used to ensure that all of the desired overburden material is removed. A common problem with current end-point detection techniques is that some degree of over-processing, also known as over-polishing, is required to ensure that all of the conductive material (e.g., metallization material or diffusion barrier layer 104) is removed from over the dielectric layer 102 to prevent inadvertent electrical interconnection between metallization lines.

One side effect of improper end-point detection or over-polishing is that dishing 108 occurs over the metal features that remain within the dielectric layer 102. The dishing effect essentially removes more metallization material than desired and leaves a dish-like top surface over the metallization lines. Dishing is known to impact the performance of the interconnect metallization lines in a negative way, and too much dishing can cause a desired integrated circuit to fail for its intended purpose.

Dishing further contributes to a non-uniform thickness of layers in a semiconductor wafer. As is known, some circuit fabrication applications require that a specific thickness of material be maintained in order to craft a working device. By way of example, the dielectric layer 102 needs to be maintained at a specific thickness to accommodate the metallization lines and associated conductive vias defined therein.

One way of performing end-point detection is to use an optical detector. Using optical detection techniques, it is possible to ascertain a level of removal of certain films from the wafer surface. This optical detection technique is designed to detect changes in the wafer surface composition by inspecting the interference patterns received by the optical detector. Although optical end-point detection is suitable for some applications, optical end-point detection may not be adequate in cases where end-point detection is desired for different regions or zones of the semiconductor wafer.

FIG. 2A shows a partial cross-sectional view of an exemplary semiconductor chip 201 after the top copper layer has undergone a CMP process. Using standard impurity implantation, photolithography, and etching techniques, P-type transistors and N-type transistors are fabricated into the P-type silicon substrate 200. As shown, each transistor has a gate, source, and drain, which are fabricated into appropriate wells. The pattern of alternating P-type transistors and N-type transistors creates a complementary metal dielectric semiconductor (CMOS) device.

A first dielectric layer 202 is fabricated over the transistors and substrate 200. Conventional photolithography, etching, and deposition techniques are used to create tungsten plugs 210 and copper lines 212. The tungsten plugs 210 provide electrical connections between the copper lines 212 and the active features on the transistors. A second dielectric layer 204 may be fabricated over the first dielectric layer 202 and copper lines 212. Conventional photolithography, etching, and deposition techniques are used to create copper vias 220 and copper lines 214 in the second dielectric layer 204. The copper vias 220 provide electrical connections between the copper lines 214 in the second layer and the copper lines 212 or the tungsten plugs 210 in the first layer.

The wafer then typically undergoes a copper CMP process to remove the overburden metallization material leaving metal only in the trenches, and the entire wafer surface as flat as possible as described with reference to FIGS. 1A–1B. After the copper CMP process, the wafer is cleaned in a wafer cleaning system.

FIG. 2B shows the partial cross-sectional view after the wafer has undergone optical end-point detection. As shown, the copper lines 214 on the top layer have been subjected to photo-corrosion during the detection process. The photo-corrosion is believed to be partially caused by light photons emitted by the optical detector and reach the P/N junctions, which can act as solar cells. Unfortunately, this amount of light, which is generally normal for optical detection, can cause a catastrophic corrosion effect.

In this cross-sectional example, the copper lines, copper vias, or tungsten plugs are electrically connected to different parts of the P/N junction. The slurry chemicals and/or chemical solutions applied to the wafer surface, can include electrolytes, which have the effect of closing an electrical circuit as electrons $e^-$ and holes $h^+$ are transferred across the P/N junctions. The electron/hole pairs photo-generated in the junction are separated by the electrical field. The introduced carriers induce a potential difference between the two sides of the junction. This potential difference increases with light intensity. Accordingly, at the electrode connected to the P-side of the junction, the copper is corroded: $Cu \rightarrow Cu^{2+} + 2e^-$. The produced soluble ionic species can diffuse to the other electrode, where the reduction can occur: $Cu^{2+} + 2e^- \rightarrow Cu$. Note that the general corrosion formula for any metal is $M \rightarrow M^{n+} + ne^-$, and the general reduction formula for any metal is $M^{n+} + ne^- \rightarrow M$. For more information on photo-corrosion effects, reference can be made to an article by A. Beverina et al., "Photo-Corrosion Effects During Cu Interconnection Cleanings," to be published in the $196^{th}$ ECS Meeting, Honolulu, Hi. (October 1999). This article is hereby incorporated by reference.

Photo-corrosion displaces the copper lines and destroys the intended physical topography of the copper features, as shown in FIG. 2B. At some locations on the wafer surface over the P-type transistors, the photo-corrosion effect may cause corroded copper lines 224 or completely dissolved copper lines 226. In other words, the photo-corrosion may completely corrode the copper line such that the line no longer exists. On the other hand, over the N-type transistors, the photo-corrosion effect may cause copper deposit 222 to be formed. This distorted topography, including the corrosion of the copper lines, may cause device defects that render the entire chip inoperable. One defective device means the entire chip must be discarded, thus, decreasing yield and drastically increasing the cost of the fabrication process. This effect, however, will generally occur over the entire wafer, thus destroying many of the chips on the wafer. This, of course, increases the cost of fabrication.

In view of the foregoing, there is a need for CMP end-point detection systems that do not implement optical detectors and enable precision end-point detection to prevent dishing and avoid the need to perform excessive over-polishing.

SUMMARY OF THE INVENTION

Broadly speaking, the present invention fills these needs by providing a system and method for using infrared emissions to determine process state, and to produce an infrared surface map of a substrate during CMP processing of substrates. The present invention can be implemented in numerous ways, including as a process, an apparatus, a system, a device, a method, or a computer readable media. Several embodiments of the present invention are described below.

In one embodiment, a chemical mechanical planarization system is disclosed. The system includes a substrate chuck that holds and rotates a substrate with at least one fabricated layer to be CMP processed. The system further includes a preparation carrier with a preparation head that is applied to a preparation surface of the substrate, such that the preparation head overlaps at least a portion of the preparation surface of the substrate that is less than an entire portion of the preparation surface of the substrate. Finally, the system includes an infrared sensor that senses infrared emission from the preparation surface of the substrate.

In another embodiment, a method for monitoring the process state of a wafer surface during chemical mechanical planarization is disclosed. The method includes joining the preparation surface and the wafer surface to remove a first layer of material from the wafer surface. The method further provides for the sensing of infrared emissions from the wafer surface during the removal of the first layer of material to determine and monitor the process state of the wafer.

In still a further embodiment, a method of end point detection is disclosed. The method includes providing a wafer that has a first layer of material to be removed from the preparation surface of the wafer, and providing a polishing pad. The method next creates frictional contact between the preparation surface of the wafer and the polishing pad to remove the first layer of material. Finally, the method provides for the sensing of infrared emissions from the preparation surface of the wafer during the removing of the first layer of material; and evaluating the infrared emissions to determine an end point of processing.

The advantages of the present invention are numerous. One notable benefit and advantage of the invention is the exploitation of infrared emissions provides an accurate determination of process end point, and avoids the prior art problems of photo-corrosion. Another benefit is the combination of infrared clearance detection with Variable Partial pad-wafer Overlap CMP processing which yields a precise and controllable CMP process. An additional benefit is the ability to utilize infrared sensing to generate infrared mapping of the entire surface of the substrate during CMP processing. In addition to process state, the infrared mapping reveals surface topography and composition, resulting in more precise semiconductor fabrication.

Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for infrared end point detection in CMP operations is disclosed. In preferred embodiments, an infrared clearance detection system includes an infrared sensor configured to a Variable Partial pad-wafer Overlap CMP system, and used to evaluate CMP process state and to provide substrate surface mapping of infrared emissions. Methods of using infrared emissions to evaluate process state and produce substrate surface mapping are also disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
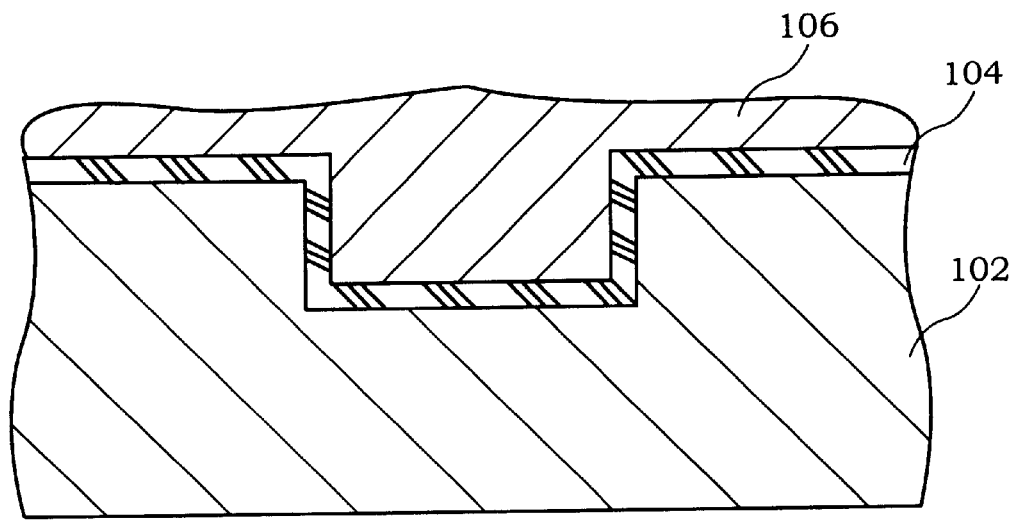
FIG. 1A shows a cross sectional view of a dielectric layer undergoing a fabrication process that is common in constructing damascene and dual damascene interconnect metallization lines.
Figure 1B:
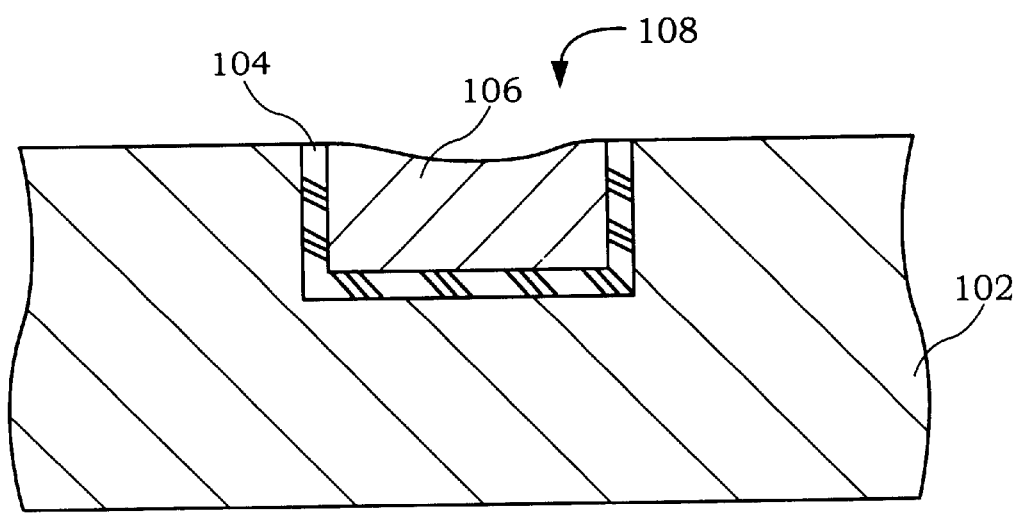
FIG. 1B shows the cross sectional view of FIG. 1A in which the overburden portion of the copper layer and the diffusion barrier layer have been removed.
Figure 2A:
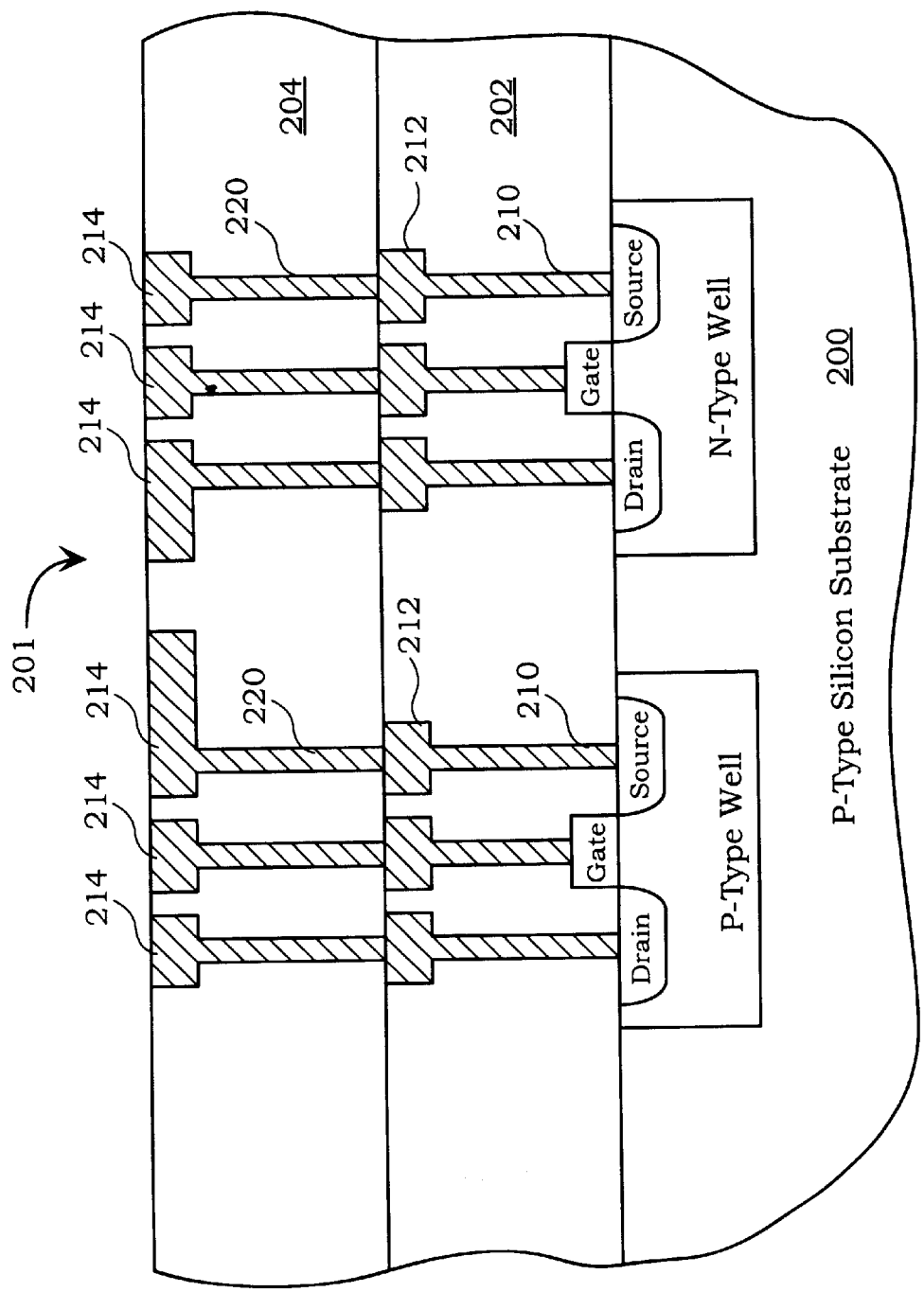
FIG. 2A shows a partial cross-sectional view of an exemplary semiconductor chip after the top copper layer has undergone a CMP process.
Figure 2B:
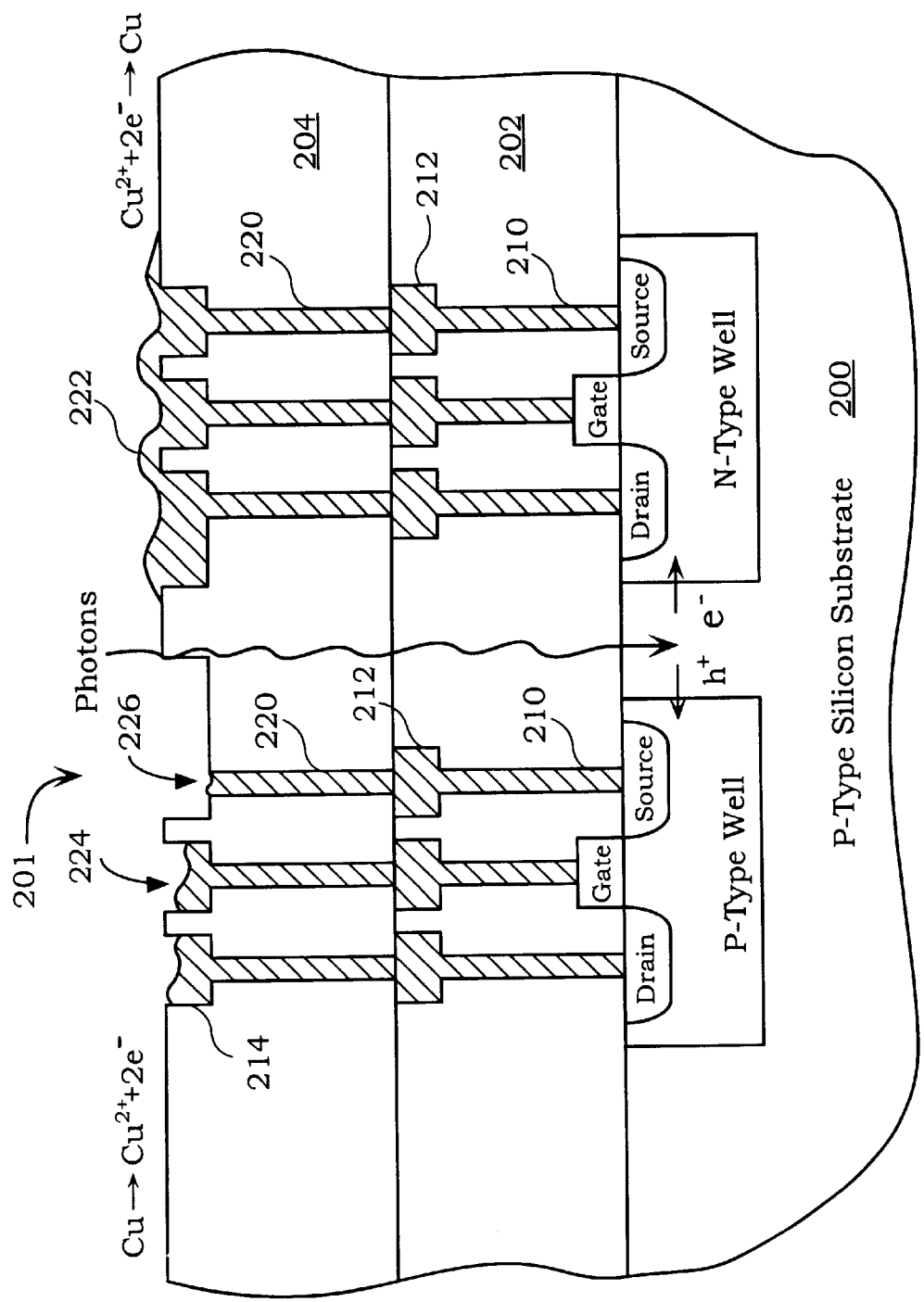
FIG. 2B shows the partial cross-sectional view of FIG. 2A after the wafer has undergone optical end-point detection.
Figure 3A:
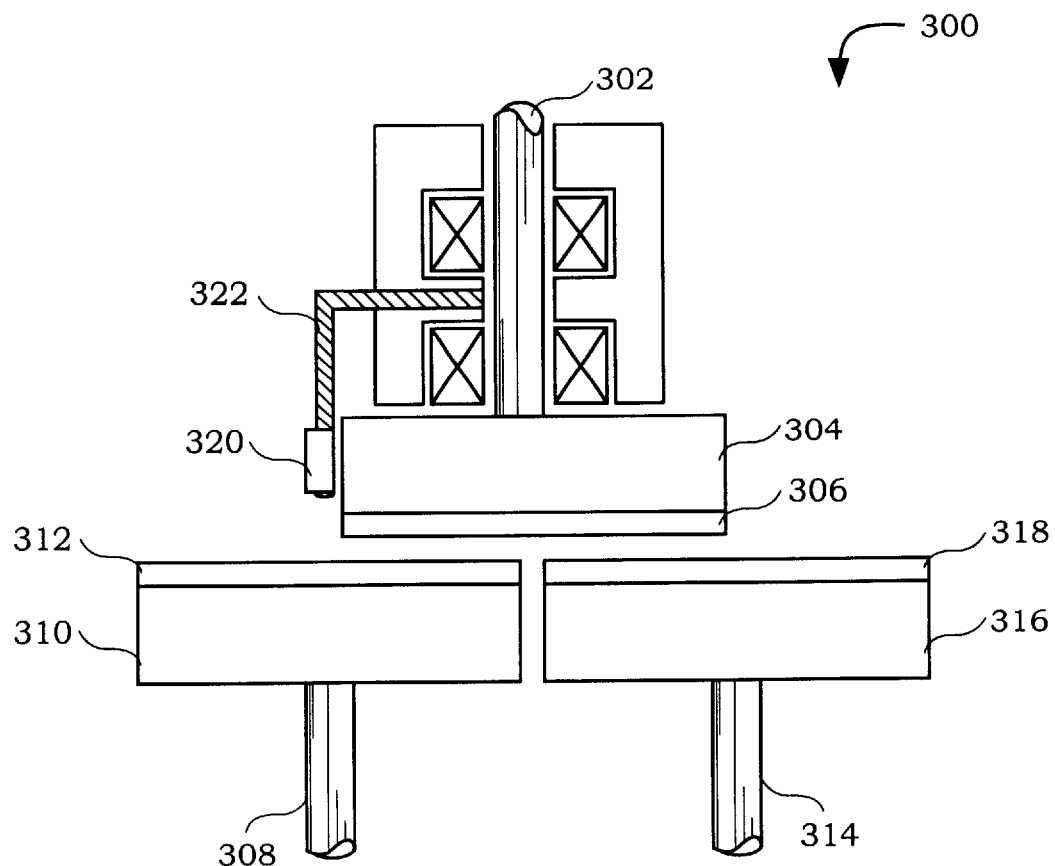
FIG. 3A shows a VaPO CMP system incorporating a single point, infrared clearance detection apparatus in accordance with one embodiment of the present invention.

FIG. 3A shows a Variable Partial pad-wafer Overlap (VaPO) CMP system incorporating a single point, infrared (IR) clearance detection apparatus (single point clearance detection system) 300 in accordance with one embodiment of the present invention. The VaPO CMP system is more completely described in co-pending U.S. patent application Ser. No. 09/644,135, filed on Aug. 22, 2000, and entitled "SUBAPERTURE CHEMICAL MECHANICAL POLISHING SYSTEM," which is hereby incorporated by reference. As described therein, a subaperture polishing configuration is a configuration in which the contact surface of a polishing pad with the wafer can at certain points in time be smaller than the surface of the wafer. The present application uses the term VaPO, and it should be understood to define the same system as "subaperture" in the incorporated reference.

The single point clearance detection system 300 includes a preparation head 306 mounted on a preparation carrier 304 which is attached to a preparation carrier shaft 302. The preparation carrier shaft 302 applies rotation to the preparation carrier 304 and preparation head 306, which can be any of a polishing pad, buffing pad, brush, fixed abrasive pad, and the like. In one embodiment, the preparation carrier shaft 302 is configured to apply oscillation in addition to rotation to the preparation carrier 304 and preparation head 306.

Below and opposing the preparation head 306, a substrate 312 is mounted on a substrate chuck 310 which is attached to a chuck shaft 308. The substrate 312 is rotated by the application of rotation to the chuck shaft 308 which rotates the substrate chuck 310 upon which the substrate 312 is mounted.

In the illustrated embodiment, a conditioning head 318 is located adjacent to, and in the same plane as, the substrate 306. The conditioning head 318 is mounted on a conditioning carrier 316 which is attached to a conditioning carrier shaft 314. In a similar manner as the substrate 312, the conditioning head 318 is rotated by the application of rotation to the conditioning carrier shaft 314. The conditioning head 318 can be a pad, a brush, or other such abrasive substance that is configured to provide continuous conditioning to the preparation head 306 during a CMP operation.

An infrared signal conduit and sensor mounting bracket 322 is shown positioned adjacent to the preparation carrier shaft 302. The IR signal conduit and sensor mounting bracket 322 is configured to conduct an IR signal to and from an IR signal processor (see FIG. 7), as well as provide an attachment for a single point infrared sensor 320. In one embodiment, the single point IR sensor 320 is a passive sensor, and the received signal is conducted to an IR signal processor. In another embodiment, the single point IR sensor 320 is an active sensor, and IR signals are transmitted from an IR signal processor to the single point IR sensor 320 as well as transmitted from the single point IR sensor 320 to an IR signal processor.

The IR signal conduit and sensor mounting bracket 322 is configured to position the single point IR sensor 320 to enable IR examination and evaluation of the substrate 312 during CMP processing. In the illustrated embodiment, a preferred location is directly over the substrate 312 being processed by a VaPO CMP system. The IR signal conduit and sensor mounting bracket 322 is configured to position the single point IR sensor 320 in a plurality of points across the surface of the substrate 312 during processing, and the IR signal conduit and sensor mounting bracket 322 is configured to move independently of the preparation carrier 304. If, for example, the preparation carrier 304 is configured to CMP a substrate 312 moving from a center of the substrate 312 to an edge of the substrate 312 in a first direction, the IR signal conduit and sensor mounting bracket 322 would be configured to position the single point IR sensor 320 over the surface of the substrate 312 moving from the center of the substrate 312 to an edge of the substrate 312 in a second direction that is opposite the first direction. Thus, as the preparation head 306 is moving along the substrate 312 from the center to the edge, the single point IR sensor is moving over the substrate 312 in an opposite direction of the preparation head 306. Because the circular substrate 312 is rotating during CMP processing, the single point IR sensor 320 is examining the same substrate 312 surface that is being CMP processed by the preparation head 306.

In another embodiment, the IR signal conduit and sensor mounting bracket 322 is attached to some other part of a CMP system, and the sensor is inserted into a position over the substrate 312 during CMP processing, and then withdrawn at the completion of the CMP operation.

As described above, the single point IR sensor 320 is positioned adjacent to the preparation head 306 in the illustrated embodiment, and focussed on the surface of the substrate 312. The distance between the single point IR sensor 320 and the surface of the substrate 312 is dependent upon the type of CMP process (e.g., whether or not slurry is used, the type of slurry used, and the like), and whether the single point IR system is active or passive. The distance between the surface of the substrate 312 and the lens or "eye" of the single point IR sensor 320 can range between approximately ½ inch and 20 inches, with a preferred distance being between 2–3 inches. In one embodiment, the IR signal conduit and sensor mounting bracket 322 is configured to both position the single point IR sensor 320 in a plurality of sensor points across the surface of the substrate 312, and to position the single point IR sensor 320 at a desired distance from the surface of the substrate 312.

Figure 3B:
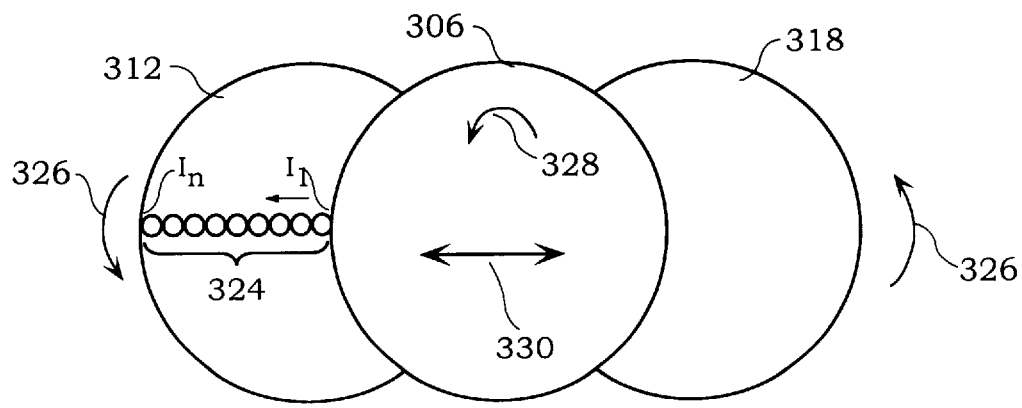
FIG. 3B illustrates the positioning of the single point infrared sensor across the surface of the substrate in accordance with one embodiment of the invention.

FIG. 3B illustrates the positioning of the single point IR sensor 320 across the surface of the substrate 312 in accordance with one embodiment of the invention. In FIG. 3B, an overhead perspective shows the substrate 312 and the conditioning head 318 adjacent to each other and rotating in a substrate process direction 326. Directly over the substrate 312 and the conditioning head 318, the preparation head 306 is shown rotating in a preparation direction 328 which, in the illustrated embodiment, is the same as the substrate process direction 326. In another embodiment, the substrate process direction 326 and the preparation direction 328 are opposite directions. In addition to rotation in the preparation head direction 328, the preparation head 306 has an oscillation 330.

Sensor points 324 are shown progressing from $I_1$ at about a center of the substrate 312 to $I_n$ at an edge of the substrate 312. In one embodiment of a single point clearance detection system 300, the active or passive single point IR sensor 320 examines the IR emission from the substrate to determine the status of the CMP process. In one embodiment, the single point IR sensor 320 begins the examination of IR emission at a point of highest removal rate on the substrate 312, typically the center of the substrate 312. The processing of the IR signal by an IR signal processor (see FIG. 7), determines the end point of the CMP processing at a particular sensor point 324, and the preparation head 306 is moved away from the center of the substrate 312 and toward an edge of the substrate 312. As desired removal is achieved, and end point determined, the single point IR sensor 320 is incrementally moved at the same time and complementary to the preparation head 306. In this manner, when the preparation head 306 moves from the center of the substrate 312 to a next position towards the edge of the substrate 312, the single point IR sensor 320 increments to a next sensor point also in a direction away from the center of the substrate 312 and towards the edge of the substrate 312. The process and incremental movement of both preparation head 306 and single point IR sensor 320 continues until the entire surface of the substrate 312 has been CMP processed and determined to have achieved the desired removal.

Figure 4A:
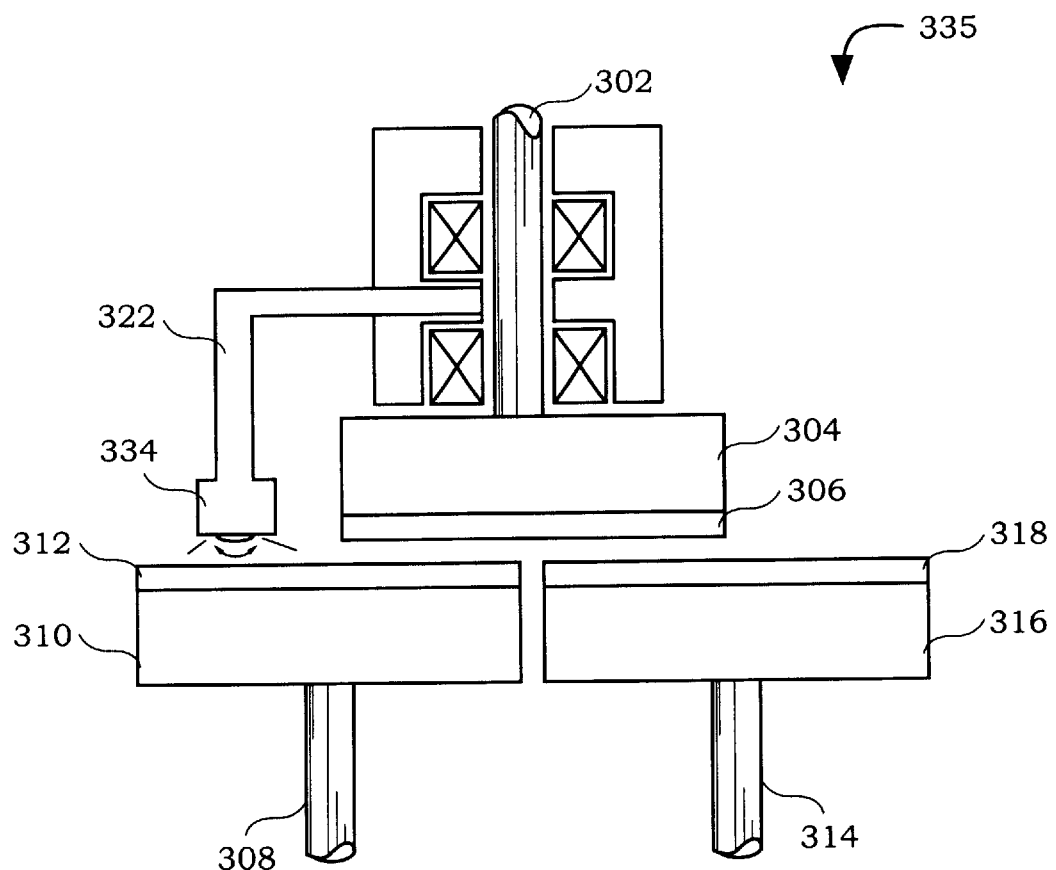
FIG. 4A shows a VaPO CMP system incorporating an infrared scanning sensor clearance detection apparatus in accordance with one embodiment of the present invention.

FIG. 4A shows a VaPO CMP system incorporating an infrared (IR) scanning sensor clearance detection apparatus (scanning sensor clearance detection system) 335 in accordance with one embodiment of the present invention. The representative VaPO CMP system shown in FIG. 4A is identical to that shown and described in FIG. 3A. While the description of the illustrated VaPO CMP system components is not repeated, component parts of the VaPO CMP system are identified with the same call-out designations as in FIG. 3A. The scanning sensor clearance detection system 335 is an embodiment of the present invention, and is further described.

FIG. 4A shows an IR signal conduit and sensor mounting bracket 322 supporting a scanning IR sensor 334. In the illustrated embodiment, the IR signal conduit and sensor mounting bracket 322 is shown attached to or near a housing surrounding the preparation carrier shaft 302. In another embodiment, the IR signal conduit and sensor mounting bracket 322 is attached to some other part of the VaPO CMP system and then positioned over the substrate 312 during CMP processing. The IR signal conduit and sensor mounting bracket 322 could then withdraw the scanning IR sensor 334 from the CMP processing environment at the conclusion of the CMP processing.

During CMP processing, the scanning IR sensor 334 is positioned over the substrate 312 being processed. As described in reference to FIG. 3A, the distance between the substrate 312 and the lens of the scanning IR sensor 334 can range between ½ inch and 20 inches, with a preferred distance between 2–3 inches, depending on process requirements. In one embodiment, the scanning IR sensor 334 is positioned in a fixed location at an approximate center of the exposed surface of the substrate 312 (e.g., that portion of the substrate not obstructed by the preparation head 306). In such an embodiment, the scanning IR sensor remains stationary in the fixed position during the CMP processing, obtaining complete coverage of the substrate surface by scanning back and forth across the surface of the substrate 312 from the fixed position. In another embodiment, the IR signal conduit and sensor mounting bracket 322 positions the scanning IR sensor 334 in a first position immediately adjacent to the preparation head 306 near the center of the substrate 312 at the beginning of the CMP process, and then incrementally moves the scanning IR sensor 334 from the center of the substrate 312 towards an edge of the substrate 312 as the preparation head 306 incrementally moves from about the center of the substrate 312 towards an edge of the substrate 312. In this embodiment, the scanning action of the scanning IR sensor 334 can provide IR mapping of the surface of the substrate, and can determine surface state over a larger region of the substrate 312 surface, as well as an anticipation of end point for more precise processing.

Figure 4B:
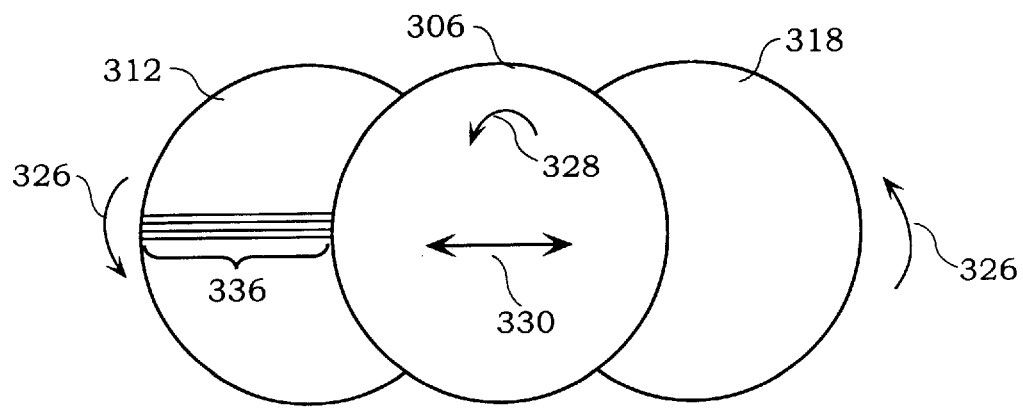
FIG. 4B shows the infrared scan path of the scanning sensor clearance detection system illustrated in FIG. 4A.

FIG. 4B shows the IR scan path 336 of the scanning sensor clearance detection system 335 illustrated in FIG. 4A. In the illustrated embodiment, the substrate 312 is shown adjacent to the conditioning head 318. Immediately over the substrate 312 and conditioning head 318 is the preparation head 306. As can be appreciated in FIG. 4B, a substantial region of the substrate 312 is unobstructed during processing by a VaPO CMP system. The scan path 336 of a scanning sensor clearance detection system 335 covers the entire surface of the substrate 312, obtains IR data from the substrate 312 surface in overlapping scan paths, and can provide a detailed IR map of the substrate surface. In one embodiment, the surface map is obtained from a passive IR sensor. In another embodiment, the surface map is obtained from an active IR sensor. Whichever embodiment is used, the scanning IR sensor 334 examines the IR emission of the substrate 312 using a continuous or intermittent scan mode with IR sensor data being obtained over time for a substrate 312 being subjected to a CMP process, and thus providing an accurate determination of end point in CMP processing, as well as an accurate predictor of process end point.

Figure 5A:
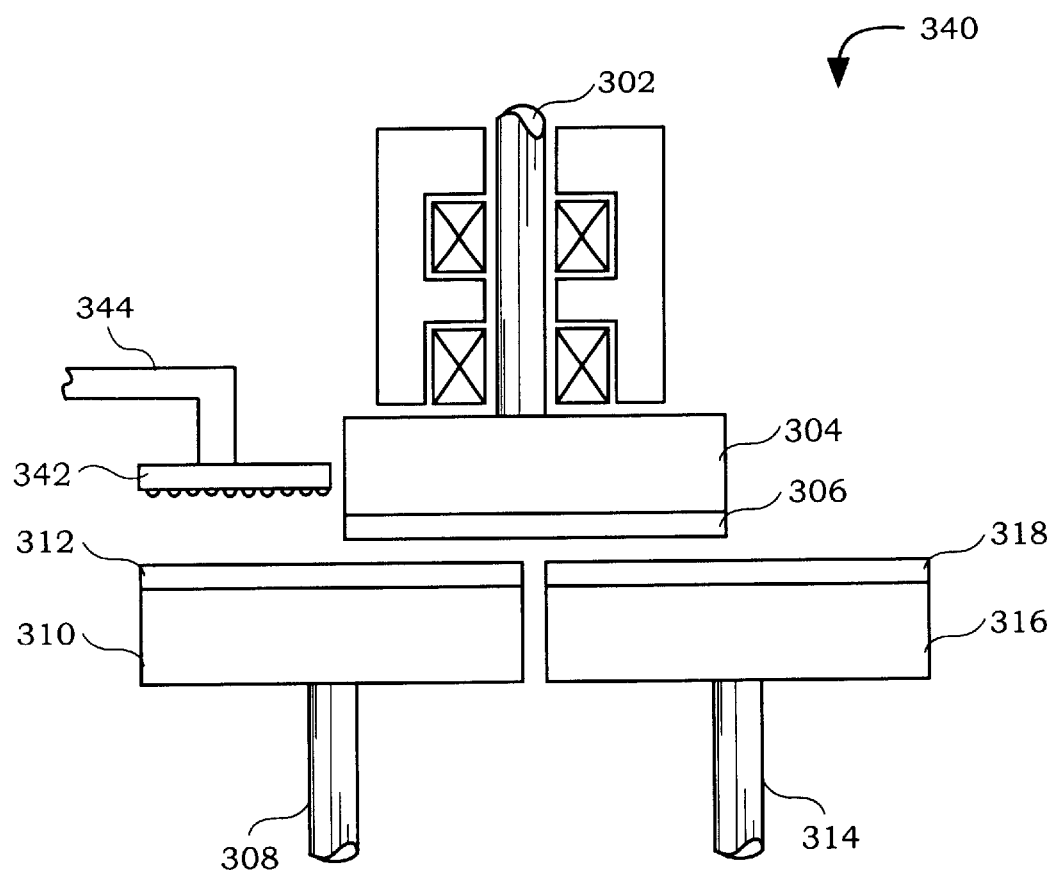
FIG. 5A shows an infrared sensor array clearance detection system in accordance with yet another embodiment of the invention.

FIG. 5A shows a sensor array clearance detection system 340 in accordance with yet another embodiment of the invention. The sensor array clearance detection system 340 is shown configured to a VaPO CMP system as described above in reference to FIG. 3A. While the description of the illustrated VaPO CMP system components is not repeated, component parts of the VaPO CMP system are identified with the same call-out designations as in FIG. 3A. The sensor array clearance detection system 340 is an embodiment of the present invention, and is further described.

An IR signal conduit and sensor mounting bracket 344 is shown positioning an IR sensor array 342 over a substrate 312 being CMP processed. In the illustrated embodiment, the IR signal conduit and sensor mounting bracket 344 is shown in a configuration other than attached to a housing surrounding the preparation carrier shaft 302. In such an embodiment, the IR signal conduit and sensor mounting bracket might position the IR sensor array 342 over the substrate 312 during CMP processing, and then withdraw the IR sensor array 342 from the processing environment at the completion of processing. In another embodiment of the invention, the IR signal conduit and sensor mounting bracket 344 is attached to a housing surrounding the preparation carrier shaft 302 as in the embodiments described in FIGS. 3A and 4A above.

The IR sensor array 342 consists of a plurality of individual IR sensors positioned adjacent to one another within a single sensor housing. In one embodiment, an IR sensor array 342 might resemble a plurality of single point IR sensors 320 (see FIG. 3A) configured in a line or array within a single sensor housing. In another embodiment, an IR sensor array 342 might resemble a plurality of scanning IR sensors 334 (see FIG. 4A) configured in a line or array within a single sensor housing. The IR sensor array 342 is then positioned over the substrate 312 to be processed, and configured to be able to examine as large a surface area of the substrate 312 as possible during CMP processing. Typically, the IR sensor array 342 has an area of coverage that includes the entire surface of the substrate 312, and can accommodate full surface mapping of larger substrates (e.g., 300 mm wafers).

Figure 5B:
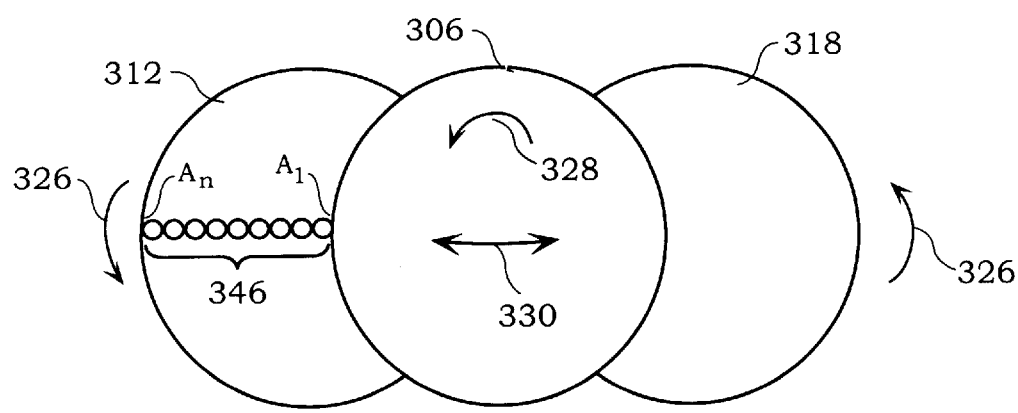
FIG. 5B illustrates representative sensor array points of the infrared sensor array clearance detection system illustrated in FIG. 5A.

FIG. 5B illustrates representative sensor array points 346 of the sensor array clearance detection system 340 illustrated in FIG. 5A. The sensor array clearance detection system 340 can be a passive or an active system. In one embodiment, the IR sensor array 342 examines a plurality of sensor array points 346 across the surface of the substrate 312 simultaneously. In another embodiment, the IR sensor array 342 examines a plurality of sensor array points 346 across the surface of the substrate 312 sequentially. In yet another embodiment, the IR sensor array 342 examines the plurality of sensor array points 346 across the surface of the substrate in a phased and predetermined order utilizing both sequential patterns and simultaneous IR data collection.

However the IR data may be collected, a sensor array clearance detection system 340 assimilates IR data from a plurality of sensor array points 346 across the surface of the substrate 312 to both determine or predict process endpoint, as well as map the surface of the substrate at any point in time in the process. The sensor array clearance detection system 340 is configured to provide an accurate determination of substrate 312 topography, and process state. With the plurality of sensors across the surface of the substrate 312, the sensor array clearance detection system is configured to filter or compensate for data irregularities that can be caused by slurry on the surface of the substrate 312, transitions between layers in surface composition of the substrate 312, and other such barriers to accurate IR mapping and data collection.

Figure 6A:
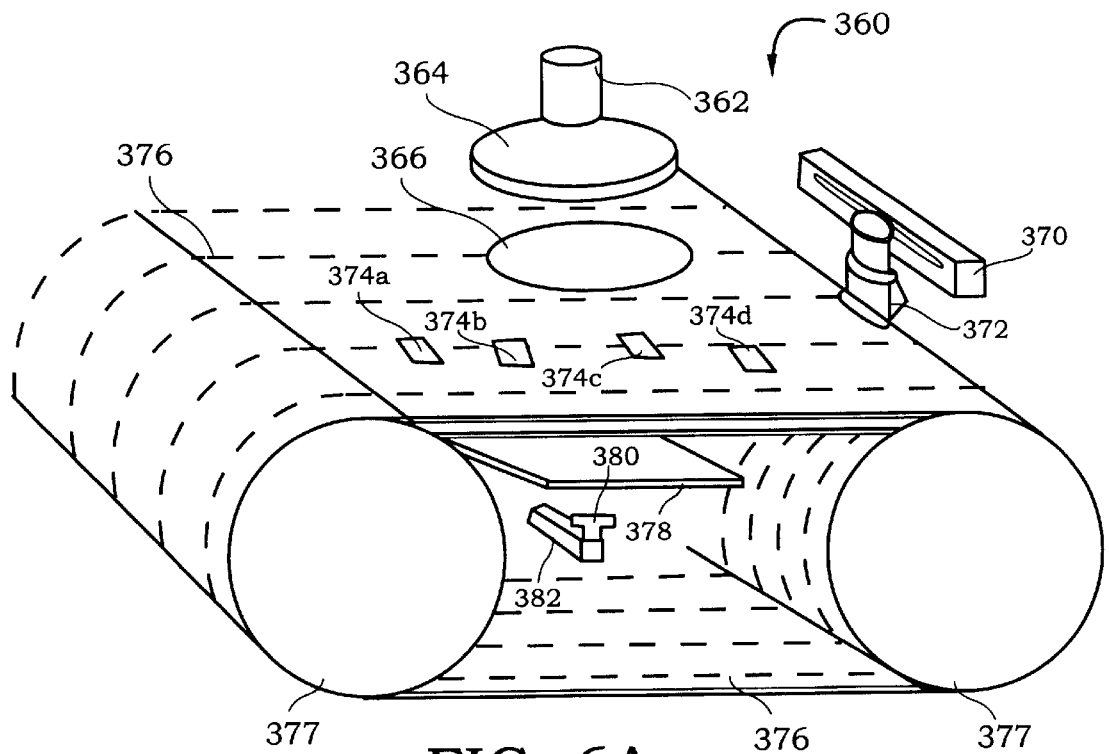
FIG. 6A shows a belt CMP system with infrared end point detection in accordance with still another embodiment of the invention.

FIG. 6A shows a belt CMP system with IR end point detection 360 in accordance with one embodiment of the invention. The illustrated belt CMP system with IR end point detection 360 includes a CMP belt 376 driven by two rollers 377. A substrate 366 is attached to a chuck 364 which is driven by a chuck shaft 362. Continuous conditioning of the belt 376 is provided by a conditioning head 372 which is positioned over and across the belt 376 by a positioning track 370. A platen 378 is configured under the belt 376 in the region beneath the substrate 366 and chuck 364 where the CMP of the substrate 366 occurs. The platen 378 provides a hard and solid surface on which the substrate 366 is applied against the belt 376 with a force in order to CMP the substrate 366. The platen 378 can also include an air bearing (not shown).

Under the platen 378, an IR sensor 380 is configured in accordance with one embodiment of the present invention. The IR sensor 380 is attached to an IR signal conduit and sensor mounting bracket 382. The IR sensor 380 is focussed upward through the platen 378, through the belt 376, and at the surface of the substrate 366. IR belt windows 374a–374d are configured in the belt 376 to allow IR sensor 380 reception and/or transmission of IR energy through the belt 376 as described in greater detail below.

Figure 6B:
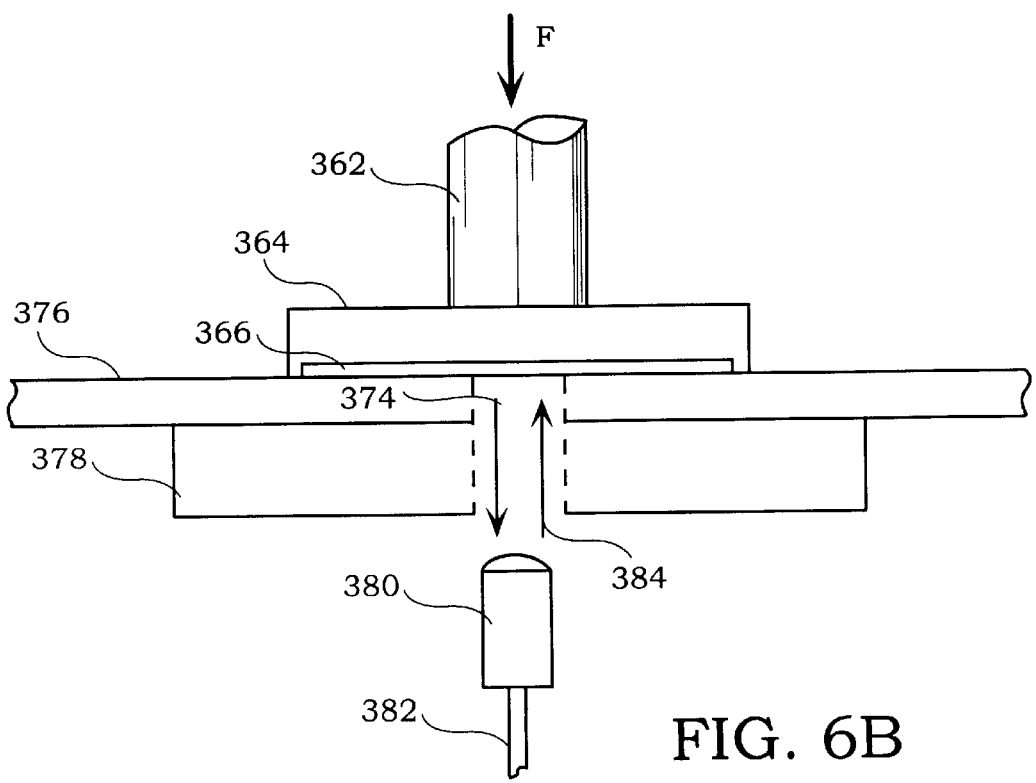
FIG. 6B shows a side detail of the transmission and reception of infrared energy in the belt CMP system with infrared end point detection illustrated in FIG. 6A.

FIG. 6B shows a side detail of the transmission and reception of IR energy in the belt CMP system with IR end point detection 360 as described in FIG. 6A. In one embodiment of the invention, the IR signal conduit and sensor mounting bracket 382 positions the IR sensor 380 directly beneath the platen 378 and directed upward towards the substrate 366. As the substrate 366 is being CMP processed, it is applied against the belt 376 and against the platen 378 with a force F transferred through the chuck shaft 362 and chuck 364. The IR end point detection can be accomplished by either an active or a passive system. The IR energy both emanating from and reflected by the substrate 366 surface is received by the IR sensor 380 and transmitted through the IR signal conduit and sensor mounting bracket 382 to an IR signal processor (see FIG. 7) for analysis. The IR energy penetrates the belt 376 through the configured IR belt windows 374. The IR signal processor (see FIG. 7) is configured, in one embodiment, to assimilate the intermittent IR signals allowed through the IR belt windows 374 into a composite determination of CMP process state and end point detection. The IR platen window 384 is directly above the IR sensor 380 and provides a fixed path for the transmission of IR energy between the IR sensor 380 and the substrate 366.

Figure 7:
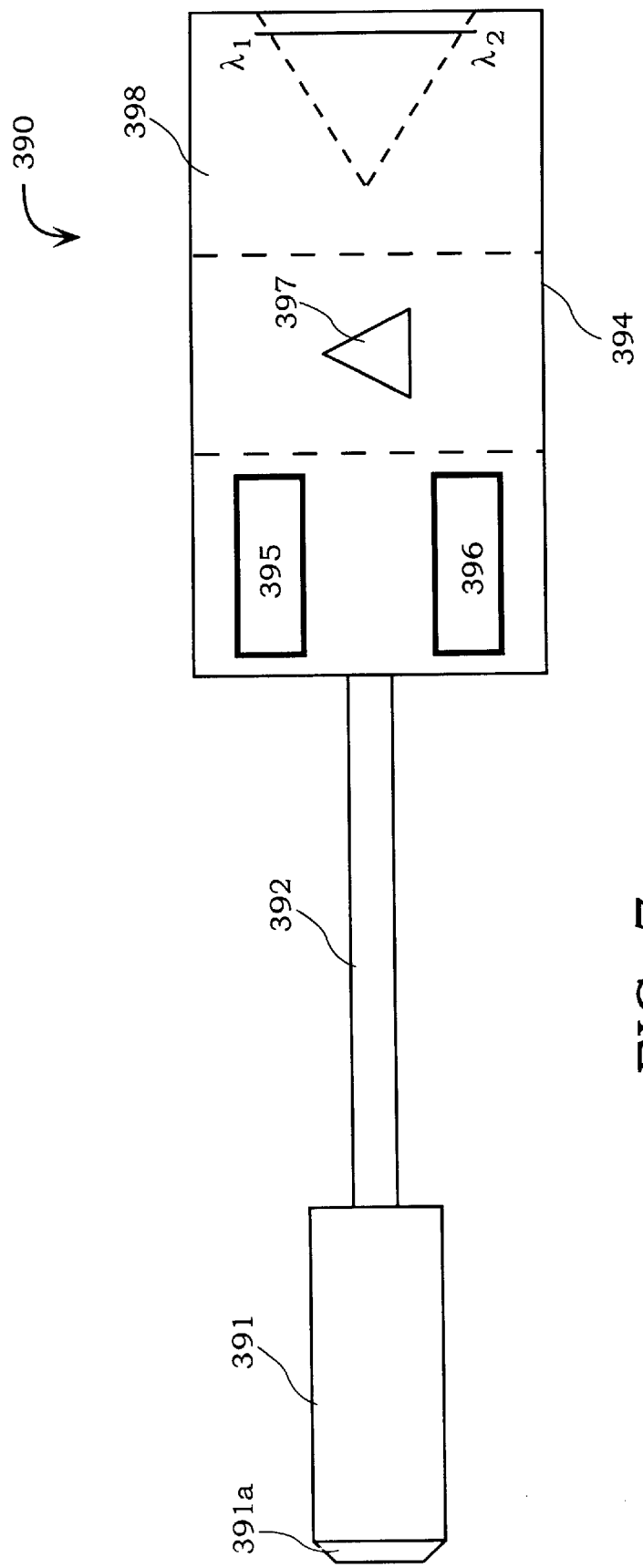
FIG. 7 is an infrared end point detection system diagram in accordance with one embodiment of the present invention.

FIG. 7 is an IR end point detection system diagram 390 in accordance with one embodiment of the present invention. The IR end point detection system diagram includes an IR sensor 391, an IR signal conduit 392, and an IR signal processor 394.

The IR sensor 391 is configured for the transmitting and receiving of an IR signal, and for the sensing of IR emissions from the surface of a substrate during CMP processing. The IR sensor 391 has a lens 391a that directs a transmitted signal and focuses a transmitted signal and a received signal in accordance with known IR technology. An example of an IR sensor is the Compact Infrared Sensor With K-Type Thermocouple Adapter, distributed by Cole-Parmer Instrument Co. of Vernon Hills, Illinois.

In various embodiments as described above, the IR sensor 391 can be a single point IR sensor 391, a scanning IR sensor 391, an IR sensor array 391, or other configuration to allow for the sensing of IR emissions from the surface of a substrate during CMP processing. The lens 391a is configured to focus in single point, scan, focus in pulsed or in a coordinated array, or other such configuration in accordance with the desired IR end point detection, surface mapping, and related applications.

IR signals travel between the IR sensor 391 and the IR signal processor 394 through an IR signal conduit 392. The transmission of IR signals is known, and IR signal conduit 392 employs common IR conduit methods.

The IR signal processor 394 includes a plurality of component parts in accordance with the particular embodiment of end point detection desired. For active endpoint detection, both a transmitter 395 and a receiver 396 might be contained therein. In another embodiment, all IR signal processors 394 contain a transmitter 395 and a receiver 396, but the transmitter 395 is only used for active IR processes. The receiver 396 is used in passive IR end point detection, and in active endpoint detection. In another embodiment, both the transmitter 395 (if required) and the receiver 396 are contained in the IR sensor 391 (instead of the IR signal processor 394), and the IR signal processor 394 performs only those signal processing functions described below.

As is known, passive IR detection and analysis involves the reception and analysis of IR emissions from a source. By way of example, any source with heat (e.g., a substrate being CMP processed) will emit varying levels of IR energy, and this IR energy can be received and analyzed to determine a number of characteristics about the source. The more information and detail known about the source, the more information is available from the analysis of its IR emissions.

Similarly, active IR analysis involves the reception and analysis of IR emissions from a source. In active IR analysis, however, IR energy is applied to the source from an IR transmitter 395, and the IR energy received and analyzed includes the reflected IR in addition to the source IR. The present invention includes embodiments having both active and passive IR end point detection.

The IR signal processor 394 includes an IR spectrometer 397 for IR analysis. As is known, an IR spectrometer 397 generally disperses IR energy into a spectrum and is calibrated to measure IR intensities at various wavelengths. In the present invention, the IR spectrometer 397 disperses the IR energy across calculated wavelengths, and then the IR spectrum analysis 398 measures the IR intensities between wavelengths $\lambda_1$ and $\lambda_2$. In one embodiment, the IR signal processor 394 is calibrated for process end point detection in accordance with the specific substrate being processed. In another embodiment, the IR signal processor 394 is calibrated for substrate mapping to generate topographic detail about a particular substrate. In such an embodiment, the substrate map or topographic detail may be displayed to a system user on a graphical display (not shown). The system user may evaluate the displayed substrate map or topographical detail to make system adjustments during substrate processing. FIGS. 8A through 9B provide examples of IR signal processor 394 calibration considerations.

Figure 8A:
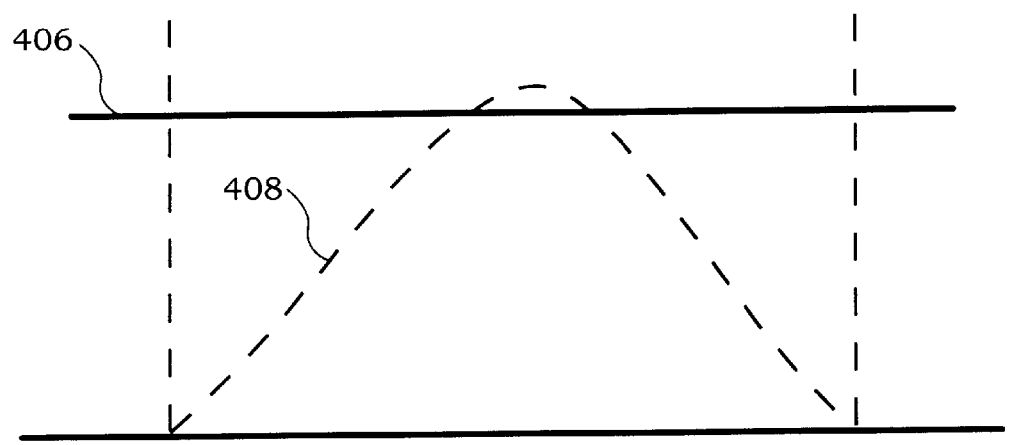
FIG. 8A is a graph of a representative absorption coefficient of a typical copper CMP process in accordance with one embodiment of the present invention.

FIG. 8A is a graph of a representative absorption coefficient 408 of a typical copper CMP process in accordance with one embodiment of the present invention. The absorption coefficient 408 is calculated for an active IR end point detection. The absorption coefficient 408 in FIG. 8A is a system coefficient, and includes the absorption of copper layers, the absorption of underlying dielectric layers and devices, the absorption of silicon, the absorption of the slurry, and other such system factors that absorb or retain IR energy. The absorption coefficient 408 is plotted between wavelengths $\lambda_1$ 402 and $\lambda_2$ 404. Line 406 represents the applied IR energy in an active IR application, and is shown as a constant between $\lambda_1$ 402 and $\lambda_2$ 404. In the illustrated embodiment, the system absorption 408 is lowest at $\lambda_1$ 402, and follows the curve shown in FIG. 8A. The illustrated absorption coefficient curve 408 is determined to correspond directly with the removal of copper during the CMP process.

Figure 8B:
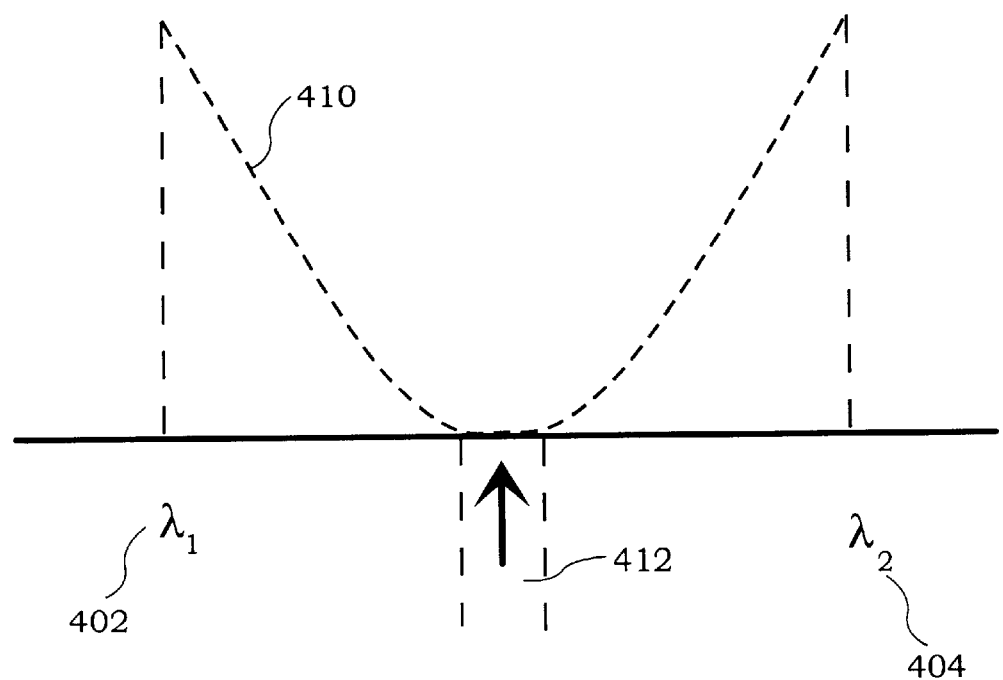
FIG. 8B is a graph of the reflected infrared energy plotted between $\lambda_1$ and $\lambda_2$ corresponding to the applied infrared energy and the absorption coefficient plotted in FIG. 8A.

FIG. 8B illustrates the useful reflection of the graph in FIG. 8A. In FIG. 8B, the reflected IR energy 410 is plotted between $\lambda_1$ 402 and $\lambda_2$ 404 corresponding to the applied IR energy 406 and the absorption coefficient 408 plotted in FIG. 8A. As shown in FIG. 8B, the optimum removal zone 412, the end point of process, is shown at the nadir of the curve representing the reflected IR energy 410. In this example, the IR signal processor 394 (see FIG. 7) is calibrated to sense or predict end point in optimal removal zone 412. The desired removal points can also be presented on a graph displayed to a system user by way of a computer monitor. Using the computer monitor, the user can also manually set or adjust CMP conditions so as to improve performance.

Figure 9A:
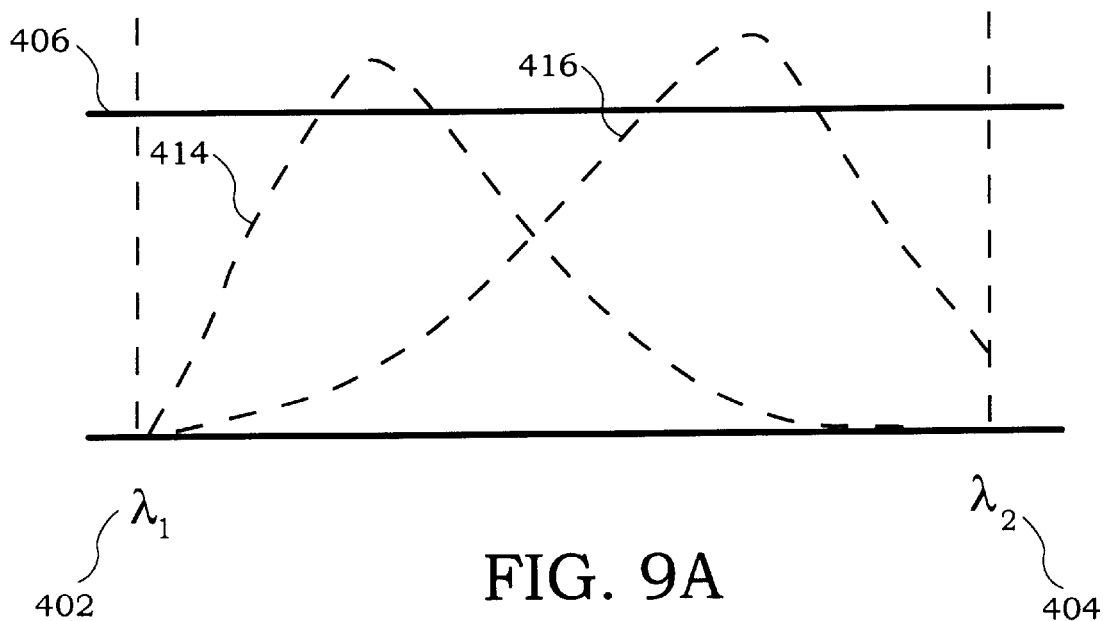
FIG. 9A is a graph of a copper absorption coefficient curve and an oxide absorption coefficient curve plotted between $\lambda_1$ and $\lambda_2$ in accordance with one embodiment of the invention.
Figure 9B:
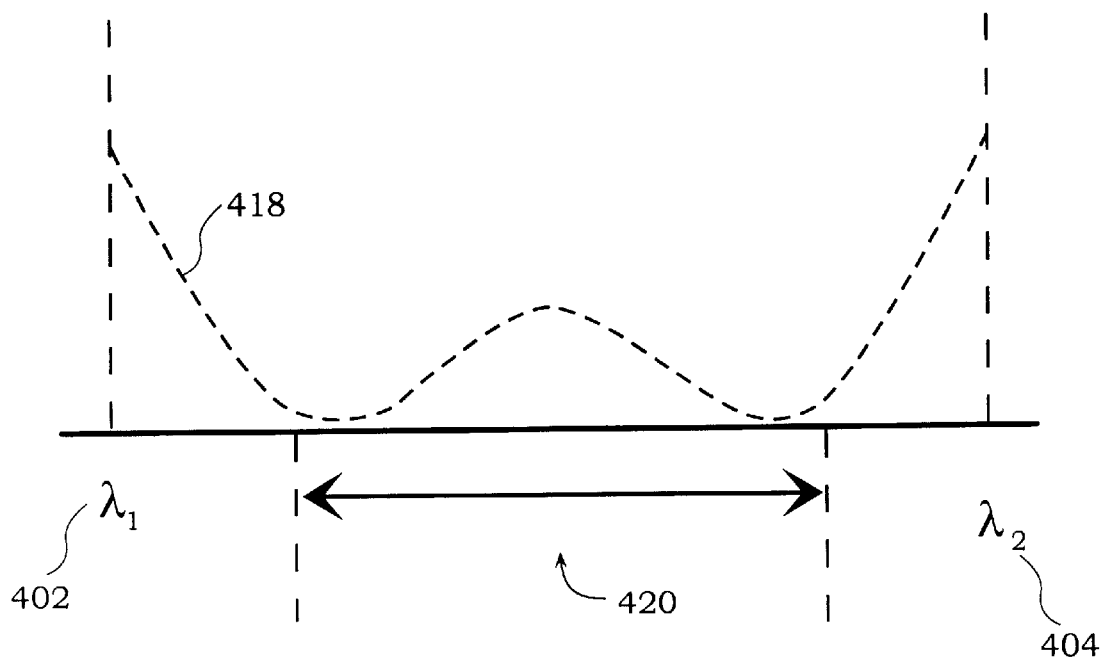
FIG. 9B is a graph of the resulting reflected infrared energy curve plotted from the data in FIG. 9A.

FIG. 9A illustrates another embodiment of IR spectrum analysis in accordance with the invention. In FIG. 9A, the applied IR energy 406 is plotted as before between $\lambda_1$ 402 and $\lambda_2$ 404. Instead of the system absorption coefficient plotted in FIG. 8A, two specific absorption coefficient curves are plotted in FIG. 9A, a copper absorption coefficient 414 and an oxide absorption coefficient 416. The resulting reflected IR energy curve 418 in FIG. 9B identifies more exactly the points of copper removal and oxide exposure. The identified optimum removal zone 420 signifies the end point of the process, and exact process end point can be can be specified based on substrate composition and process requirements. Further, the specifically identified substrate component absorption curves (e.g., copper and oxide) can be utilized in one embodiment to produce a map of the substrate surface topography based on IR spectrum analysis.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A chemical mechanical planarization system, comprising:
   a substrate chuck configured to hold and rotate a substrate having one or more formed layers to be prepared;
   a preparation carrier having a preparation head being configured to be applied to a preparation surface of the substrate, such that the preparation head overlaps at least a portion of the preparation surface of the substrate that is less than an entire portion of the preparation surface of the substrate; and an infrared sensor positioned to sense infrared emission from the preparation surface of the substrate; and an infrared signal processor being configured to process infrared data from the infrared sensor,
wherein the infrared signal processor includes an infrared transmitter for transmitting infrared energy to the preparation surface of the substrate.

2. A chemical mechanical planarization system as recited in claim 1, wherein the infrared sensor is a single point infrared sensor configured to sense infrared emission from the preparation surface of the substrate from a plurality of single points across the preparation surface of the substrate.

3. A chemical mechanical planarization system as recited in claim 1, wherein the infrared sensor is an infrared scanning sensor configured to sense infrared emission from the preparation surface of the substrate by scanning across the preparation surface of the substrate.

4. A chemical mechanical planarization system as recited in claim 1, wherein the infrared sensor is an infrared sensor array configured to sense infrared emission from the preparation surface of the substrate with a plurality of infrared sensors configured in an array, each of the plurality of infrared sensors configured in an array examining a plurality of single points across the preparation surface of the substrate.

5. A chemical mechanical planarization system as recited in claim 1, wherein the infrared sensor is an infrared sensor array configured to sense infrared emission from the preparation surface of the substrate with a plurality of infrared sensors configured in an array, each of the plurality of infrared sensors configured in an array scanning across the preparation surface of the substrate.

6. A chemical mechanical planarization system as recited in claim 1, wherein the infrared signal processor evaluates the infrared data received from the infrared sensor to determine wafer surface state and an end point of chemical mechanical planarization of the substrate.

7. A chemical mechanical planarization system as recited in claim 1, wherein the infrared signal processor examines the infrared data received from the infrared sensor to create an infrared emission map of the preparation surface of the substrate, characterizing the substrate surface state.

8. A chemical mechanical planarization system as recited in claim 6, wherein the endpoint of chemical mechanical planarization of a substrate is observable on a wavelength plot of infrared emission.

9. A chemical mechanical planarization system as recited in claim 8, further comprising a monitor being configured to display infrared data from the infrared signal processor.

10. A chemical mechanical planarization system as recited in claim 9, wherein displayed infrared data includes the wavelength plot of infrared emission.

11. A chemical mechanical planarization system as recited in claim 9, wherein displayed infrared data includes an infrared map of the preparation surface of the substrate.

12. A method of monitoring a process state of a wafer surface during chemical mechanical planarization by a preparation surface, comprising:

joining the preparation surface and the wafer surface to remove a first layer of material from the wafer surface;

transmitting infrared energy to the wafer surface from an infrared sensor during the removal of the first layer of material; and sensing infrared emissions from the wafer surface during the removal of the first layer of material.

13. A method of monitoring a process state of a wafer surface during chemical mechanical planarization by a preparation surface as recited in claim 12, further comprising evaluating the infrared emissions from the wafer surface during the removal of the first layer of material, the infrared emissions indicating a completion of removal of the first layer of material from the wafer surface.

14. A method of monitoring a process state of a wafer surface during chemical mechanical planarization by a preparation surface as recited in claim 13, wherein the first layer of material is a metal layer.

15. A method of monitoring a process state of a wafer surface during chemical mechanical planarization by a preparation surface as recited in claim 14, wherein the metal layer is over an oxide layer.

16. A method of monitoring a process state of a wafer surface during chemical mechanical planarization by a preparation surface as recited in claim 15, further comprising:

calculating an infrared absorption coefficient of the metal layer;

calculating an infrared absorption coefficient of the oxide layer; and generating a graph of the infrared emissions from the wafer surface during the chemical mechanical planarization.

17. A method of monitoring a process state of a wafer surface during chemical mechanical planarization by a preparation surface as recited in claim 16, further comprising adjusting parameters of the chemical mechanical planarization in accordance with results provided by the generated graph of the infrared emissions from the wafer surface.

18. A method of monitoring a process state of a wafer surface during chemical mechanical planarization by a preparation surface as recited in claim 17, wherein the adjusting parameters of the chemical mechanical planarization includes repositioning the preparation surface and stopping chemical mechanical planarization.

19. A method of end point detection, comprising:

providing a wafer having a first layer of material to be removed from a wafer preparation surface;

providing a polishing pad;

creating frictional contact between the wafer preparation surface and the polishing pad to remove the first layer of material;

positioning an infrared sensor proximate to the wafer preparation surface;

transmitting infrared energy to the wafer preparation surface during the removing of the first layer of material;

sensing infrared emissions from the wafer preparation surface during the removing of the first layer of material; and evaluating the infrared emissions from the wafer preparation surface during the removing of the first layer of material to determine a completion of the removing of the first layer of material from the wafer preparation surface.

20. A method of end point detection as recited in claim 19, wherein the first layer of material is a metal layer.

21. A method of end point detection as recited in claim 20, wherein the metal layer is fabricated on an oxide layer.

22. A method of end point detection as recited in claim 21, further comprising:

calculating an infrared absorption coefficient for the metal layer;

calculating an infrared absorption coefficient for the oxide layer; and generating a plot of the infrared emissions from the surface of the wafer.

23. A method of end point detection as recited in claim 22, further comprising:

displaying the plot for operator analysis.

24. A method of end point detection as recited in claim 19, wherein the infrared sensor is connected to an infrared signal processor by an infrared signal conduit.

25. A method of end point detection as recited in claim 19, wherein the infrared signal processor is configured for transmission, reception, and analysis of infrared energy.

* * * * *